United States Patent [19]

Heckl

[11] 3,903,592

[45] Sept. 9, 1975

[54] PROCESS FOR THE PRODUCTION OF A THIN LAYER MESA TYPE SEMICONDUCTOR DEVICE

[75] Inventor: Herwig Heckl, Munich, Germany

[73] Assignee: Siemens Aktiengesellschaft, Berlin, Germany

[22] Filed: May 13, 1974

[21] Appl. No.: 469,114

[30] Foreign Application Priority Data

May 16, 1973 Germany .......... 2324780

[52] U.S. Cl. .......... 29/578; 29/580; 357/56

[51] Int. Cl.$^{2}$ .......... B01J 17/00

[58] Field of Search .......... 29/580, 578, 588, 583; 156/17; 357/56

[56] References Cited

UNITED STATES PATENTS

| | | | |
|---|---|---|---|
| 3,519,506 | 7/1970 | Topas | 156/17 |
| 3,689,993 | 9/1972 | Tolar | 29/580 |
| 3,765,970 | 10/1973 | Athanas | 29/580 |
| 3,816,194 | 6/1974 | Kroger | 156/17 |

*Primary Examiner*—W. Tupman
*Attorney, Agent, or Firm*—Hill, Gross, Simpson, Van Santen, Steadman, Chiara & Simpson

[57] ABSTRACT

Process for the production of a thin layer mesa type semiconductor device which includes starting with a thin disc of semiconductor material, forming an epitaxial layer on one major surface thereof, forming a mask above a region where a mesa is to be formed, etching away the portion of the epitaxial layer not covered by the mask and part of the thickness of the disc below the etched portion of the epitaxial layer, removing the mask, covering the remaining epitaxial layer and the etched surface disc with a thin layer from a group consisting of chromium, nickel, platinum, palladium, molybdenum, titanium and aluminum, forming a second relatively thick metal layer on the thin metal layer to form a sandwich type first electrode, whereby mesas are formed as circular bumps with a first electrode having circular upstanding wall portions and a flat dome portion, etching away the remaining portion of said disc up to the first electrode layer outside of said mesa and up to a level slightly therebeyond where said electrode layer forms part of the mesa, forming a second electrode on said remaining exposed portion of said disc surface, said second electrode also acting as a second mask, forming an annular trough on the undersurface of said mesa by etching around said second mask until the first electrode surface has been reached, and severing resulting composite article through the first electrode outside the mesa region.

The resulting device may then be mounted on a metal support by thermo-compression applied through the upstanding wall of the mesa and possibly through the device itself.

14 Claims, 5 Drawing Figures

PROCESS FOR THE PRODUCTION OF A THIN LAYER MESA TYPE SEMICONDUCTOR DEVICE

BACKGROUND OF THE INVENTION

The invention relates to a process for the production of a semiconductor component in which a disc-shaped semiconductor crystal is covered on its top surface with a uniform epitaxial layer. The epitaxial layer is then partially removed, forming at least one mesa-like projection. The mesa-like projection is provided on its top with a metal electrode.

This is a conventional technique in the production of mesa-epitaxial transistors and mesa-epitaxial diodes. The junction between the original disc-shaped semiconductor crystal and the epitaxial layer can be in the form of a *pn*-junction. In most cases, however, it is an *nn*+- or a *pp*+-junction.

The present invention is concerned less with the production of a semiconductor device of a mesa type, than with the production of so-called thin layer elements in which the semiconductor body is thus arranged in the form of a thin layer between two electrodes of a more or less laminar design. As a rule, a junction, which extends in parallel to the contact face of these electrodes, is provided between zones of differing conductivity types. This arrangement is intended in particular to be developed into an avalanche diode, and in particular also as a Schottky diode or also a Gunn diode or varactor diode.

Frequently semiconductor compounds, e.g., GaAs or GaP, which are technologically more difficult to handle than silicon or germanium, are used for the production of such components. The processes required to form thin layer diodes of this type easily lead to cracks and other damage to the fragile semiconductor crystals which may affect the function of the elements. In addition, inaccuracies of the geometric dimensions can easily occur.

BRIEF SUMMARY OF THE INVENTION

The object of this invention is to provide a remedy in this respect. To this end, the invention is based upon a process wherein not only the top but also the flanks and surrounding area of the mesa-like projection which is formed on the epitaxial layer and which is higher than the thickness of the epitaxial layer are entirely covered with a first metal electrode layer. The original disc-shaped semiconductor crystal is then uniformly removed on the side opposite the mesa-like projection until the metal of the first electrode covering the surroundings of the mesa-like projection is exposed on the removal side in the form of a ring surrounding the base of the mesa-like projection, which latter contains a residue of the epitaxial layer and of the original semiconductor crystal. Then the semiconductor surface which has been newly formed by the removal process is provided with an etching mask which is separated in insular fashion from the first metal electrode and is preferably in the form of a second metal electrode with the aid of which further semiconductor material is etched away until the junction between the basic material and the epitaxial layer in the semiconductor residue formed by the former mesa-like projection is no longer short-circuited by the metal of the first electrode.

Preferably the first electrode is designed as a rectifying electrode in particular with a Schottky contact in the case of the production of an avalanche transit time diode. The following description will now preferably relate to this special case. In the case of the production of a Gunn diode, both electrodes are designed as ohmic contacts. Finally the junction produced by epitaxy can either be a *pn*-junction or at least lead to a *pn*-junction on one of the electrodes. The first electrode is always in the form of a self-supporting layer of high stability which means that it is capable of absorbing the mechanical strains which occur later during the processing. The final thickness of the component will be seen to correspond at the maximum merely to the height of the original mesa on the epitaxial layer.

In this process, preferably the following measures are taken:

1. The rectifying contact which produces the first electrode is a Schottky contact. If one of the metals of a group consisting of chrome, nickel, platinum, palladium, molybdenum, titanium or aluminum is used for this purpose, it is frequently advisable to provide that only the part of this electrode which is directly in contact with the semiconductor body consists of the metal capable of forming the Schottky contact, whereas the remainder of the first electrode consists of a mechanically more stable metal.

2. The etching mask which is to be used in the second mesa etching process is preferably simultaneously forms the electrode which contacts the remaining *n*+ residue of the original semiconductor body.

BRIEF DESCRIPTION OF THE DRAWINGS

The various stages of the preferred embodiment of the production process are illustrated in FIGS. 1 to 5 of the drawings by showing fragmentary sectional views.

DETAILED DESCRIPTION OF A PREFERRED EMBODIMENT

Figure 1:
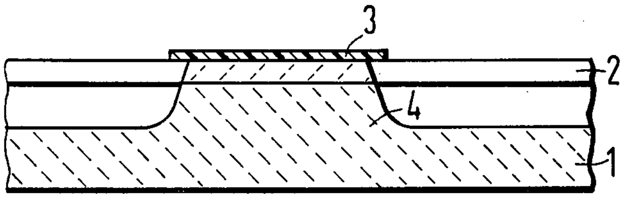
Figure 2:
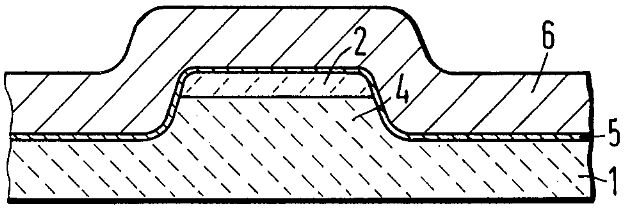

The invention will now be described in detail by making reference to FIGS. 1 to 5, assuming that an avalanche transit time diode with a Schottky contact is to be produced.

The starting point is an approximately 100 to 400 $\mu$m thick, *n*+ -conducting disc 1 of gallium arsenide (e.g., with a doping concentration of more than $10^{14}$ cm$^{-3}$) on the top surface of which is deposited an epitaxial layer 2 which is composed of the same material and possesses a thickness of approximately 2$\mu$m. As the term "disc" is herein used, it refers to a thin flat object whether circular, square or rectangular in its peripheral configuration. The doping of the epitaxial layer 2 is approximately $2.10^{16}$ cm$^{-3}$ and consists for example of tin (Sn). To the epitaxial layer 2 is then applied a photo lacquer mask 3 which covers one or several insular zones of the free surface of the epitaxial layer 2. These insular photo lacquer masks 3 are, for example, arranged in 1000 $\mu$m grid pattern and each has a diameter of approximately 650 $\mu$m.

A suitable photo lacquer is, for example, the type AZ 1350.

With the aid of this photo lacquer etching mask 3 and a suitable etching agent, on its side provided with the epitaxial layer 2, the semiconductor body is subjected to an etching treatment until at least one mesa-like projection 4 is formed, the height of which is greater than the thickness of the epitaxial layer 2. As a consequence, the mesa-like projection 4 is provided on its base surface with a part of the original *n*+ -material 1, which later has a favorable influence on the formation of the ohmic contact with the second electrode (FIG. 1).

If a plurality of elements are produced next to one another from the same semiconductor disc, several mesa-like projections 4 will be produced on the same side of the semiconductor disc, thus on the surface of the epitaxial layer 2 in that a plurality of photo lacquer etching masks 3, arranged in particular in the form of a grid pattern, are applied simultaneously.

Following the etching process, the photo lacquer mask 3 is removed and the arrangement is briefly over-etched, in order to round off the edges. Then the side of the arrangement provided with the mesa-like projection 4 is covered with a layer 5 consisting of the metal of the first electrode. In the present example, this is Cr and is intended to produce a Schottky contact with the *n*-conducting material at the top of the mesa-like projection 4. If necessary, a thermal treatment is given in order to achieve a rectifying contact between the first electrode 5 and the semiconductor, e.g., in the case of the production of a *pn*-junction. If a vapor-deposited or galvanically produced Cr layer 5 is being used, the latter is expediently strengthened by a considerably thicker Ag layer 6. It is advisable to set the overall thickness of the first electrode 5, 6 at 20 to 300 $\mu$m. Then the mesa structure of the underlying semiconductor surface also continues through the electrode. Possibly the free surface of the first electrode is also covered with a solder layer or another bonding layer composed, e.g., of an AuGe alloy which facilitates the later installation of the element.

Figure 3:
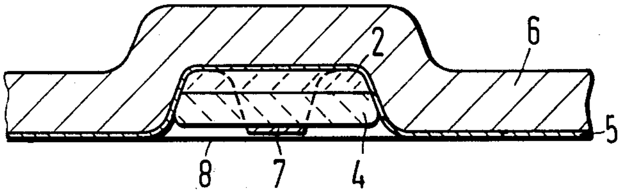

It is now in accordance with the invention to proceed as shown in FIG. 3 in such a manner that the GaAs body 1 is uniformly removed on the side opposite the first electrode 5, 6 until the lowest points of the first electrode are visible on the removal side in the form of a ring of metal surrounding the base of the mesa-like projection. The remaining semiconductor residue then consists merely in the former mesa-like projection, and its base is formed of the residue of the former $n+$ zone and its top surface of the remainder of the former epitaxial layer. If a plurality of such mesa-like projections 4 have been produced next to one another on the semiconductor surface, a corresponding number of semiconductor residues, surrounded by the first electrode, will be obtained, if the electrode 5, 6 has been uniformly applied over the entire surface of the GaAs body provided with mesa-like projections. Then each of these semiconductor islands is processed to form a semiconductor element. Finally, following the completion of all other processes, the first electrode 5, 6 which still holds together the individual elements is separated as along line 10 (FIG. 4), e.g., by sawing or by etching.

If the thickness of the $n+$-conducting residue 1 of the former crystal 1 is to be further reduced, the base surface of the islands which have been formed can also be exposed to the effects of an etching agent which in particular does not attack the first electrode. FIG. 3 has taken into account a reduced thickness, produced by such an intermediate etching process, of the semiconductor residue corresponding to the former mesa-like projection.

It is now in accordance with the invention to proceed in such a manner that the exposed base surface of the still present semiconductor residue 4 is provided with a laminar electrode 7 which contacts the $n+$-conducting material in non-blocking fashion, and which is suitable to simultaneously serve as an etching mask. If the electrode 7 is not resistant to etching, it is expediently covered with an etching mask which also projects somewhat at all points over the edge of the electrode 7 to avoid the electrode 7 being underetched. However, even if the electrode 7 is resistant to etching, it will for the same reason be surrounded by a ring-shaped photo lacquer layer which closely adjoins the electrode 7 all around, so that in the finished component the electrode does not project laterally beyond the semiconductor body of the element.

The production of the limited metal layer which forms the second electrode in the element which is to be made, can be carried out for example, by vapor depositing the electrode metal over the entire surface, and then removing the excess electrode metal from the unwanted spots with the aid of the photo lacquer etching technique. However, it can also be initially vapor deposited or galvanically applied in selective fashion with the aid of an appropriate vaporization mask.

It should also be noted that in order to be able to fulfill their function, the electrodes 5, 6 and 7 may require to be tempered in. It should also be noted that in the present example, the second electrode 7 always contacts only the $n+$-conducting residue on the base surface of the remaining semiconductor residue 4. Similarly to the electrode 5, 6, the ohmic electrode 7 may possibly also be in the form of a plurality of layers. For example, a 12 percent Au-Ge layer covered by a Cr-Ni layer, which latter is covered by an Au-layer can directly adjoin the GaAs. It is also possible for the first electrode 5, 6 to be provided with other layers, e.g., a layer which facilitates the later installation of the element, on the free surface of the Ag - layer 6. The diameter of the second electrode 7 can, for example, amount to 50 to 300 $\mu$ m.

If a plurality of elements are produced next to one another, each element will be provided with its own second electrode 7 which is insularly separated from the first electrode 5, 6 which is common to all the elements.

Figure 4:
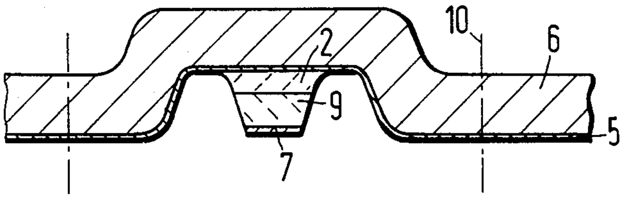
Figure 5:
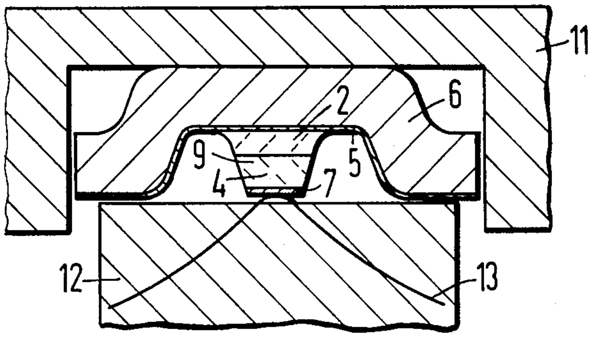

The next stage of the process of the invention is another etching process with the aid of which the previously existing shortcircuit of the $n+n$ junction in the remaining semiconductor body 4 is removed. Using the electrode 7 as the etching mask (or using a special etching mask prior to the application of the electrode 7), semiconductor material is etched away in the form of a ring around the electrode 7 (or the etching mask corresponding to the latter) until this short circuit by the first electrode 5, 6 is eliminated.. Generally, one will continue to remove further semiconductor material until only a frustum 9 remains, the top surface of which is covered and contacted by the first electrode 5, 6, and the base surface of which is covered and contacted by the ohmic electrode 7. The remaining part of the original $n+n$ junction extends parallel to the two electrodes transversely through the frustum 9 (FIG. 4).

If a plurality of elements have been produced next to one another from the semiconductor disc, it is now time to divide up the first electrode between the individual elements, to make these independent. This is illustrated by the broken line 10 in FIG. 4.

Finally the element is installed in a housing in the usual manner. The possibility of designing the electrode 5, 6 in sturdy form can be exploited if, as shown in FIG. 4, this electrode is joined to a metallic base 11 provided for the mounting of the element, by means of thermo-compression using a ram 12 (FIG. 5) which comes into contact only with this electrode. It is also possible to apply a different technique, e.g., ultrasonic soldering or welding. The installed element is finally briefly over-etched once more and then brought into permanent contact with a terminal 13 which contacts the electrode 7, e.g., in the cover of the housing, when the latter is closed.

It will be clear that the case described in the Figures may only be an exemplary embodiment. For example, a Gunn diode can be produced in similar fashion. However, the electrode 5, 6 will also be formed as an ohmic contact, like the second electrode 7. In the case of the production of a varactor diode on the other hand, it will be ensured that the first electrode forms a pn-contact with the material of the epitaxial layer 2. Finally, it is also possible for the junction between the epitaxial layer 2 and the starting crystal 1 to be *pn*-junction.

It will be apparent to those skilled in the art that many modifications and variations may be effected without departing from the spirit and scope of the novel concepts of the present invention.

I claim as my invention:

1. A process for the production of a semiconductor component in which a disc-shaped semiconductor crystal is covered on its top surface with a uniform epitaxial layer, the epitaxial layer being then partially removed, forming at least one mesa-like projection, the mesa-like projection being provided on its top with a metal electrode, comprising covering the top and also the flanks and surrounding area of the mesa-like projection which is formed on the epitaxial layer and which is higher than the thickness of the epitaxial layer with a first metal electrode in the form of a layer, the original disc-shaped semiconductor crystal being then uniformly removed on the side opposite the mesa-like projection until the metal of the first electrode covering the surroundings of the mesa-like projection is exposed on the removal side, in the form of a ring surrounding the base of the mesa-like projection, which latter contains a residue of the epitaxial layer and of the original semiconductor crystal, then providing the semiconductor surface which has been newly formed by the removal process with an etching mask which is separated in insular fashion from the first metal electrode and in the form of a second metal electrode, with the aid of which further semiconductor material being etched away until the junction between the basic material and the epitaxial layer in the semiconductor residue formed by the former mesa-like projection is no longer short-circuited by the metal of the first electrode.

2. A process according to claim 1, in which a metal capable of forming a Schottky contact is used as the material for the first electrode.

3. A process according to claim 1, in which a metal capable of forming an ohmic contact is used as the material for the second electrode.

4. A process according to claim 2, in which *n*-conducting GaAs is used for the epitaxial layer, for the first electrode, at least one of the metals Cr, Ni, Pt, Pd, Mo, Ti or Al is used, in the form of a vapor-deposited layer.

5. A process according to claim 1, in which an *n*+-conducting, disc-shaped GaAs monocrystal is used as the starting material.

6. A process according to claim 1, in which the metal layer which forms the first electrode is strengthened by the application of a further layer composed of a different metal.

7. A process according to claim 6, in which the first electrode consists of Cr, Ni, Pt, Pd, Mo, Ti or Al and forms a Schottky contact with the semiconductor and is strengthened by an Ag layer.

8. A process according to claim 1, in which a plurality of elements are produced from one single semiconductor disc and in which the side of the disc-shaped semiconductor crystal which is provided with the epitaxial layer is provided with a plurality of identical mesa-like projections arranged in the form of a grid pattern, and the relevant side of the arrangement is as a whole, covered with a layer consisting of the metal which forms the first electrode.

9. A process according to claim 8, in which the semiconductor islands which, as a result of the removal of the original semiconductor material have remained on the side of the dis-shaped semiconductor crystal opposite the mesa-like projections, and which have been produced by the former mesa-like projections, are, on their base surfaces, provided each with a laminar ohmic contact which is separated in insular fashion from the common first electrode.

10. A process according to claim 1, in which, following the final etching process, the semiconductor bodies corresponding to the individual elements are obtained in the form of frustum-like components with at least one junction which corresponds to the junction between basic material and epitaxial layer and runs parallel to the base surface and top surface of the frustum, in particular a *n-n*+ junction, and whose top surface is covered by the first metal electrode and whose base surface is covered by the second electrode.

11. A process according to claim 1, in which a second electrode which serves as an etching mask is supported in its function as etching mask by a second etching mask which adjoins the edge of the first mask in the form of a ring, and which is a photo lacquer mask.

12. A process according to claim 1, in which the element is assembled in a housing with the first electrode of the element being permanently connected to a metallic base by means of thermo-compression.

13. A process according to claim 12, in which the thermo-compression takes place through the use of a ram which exerts pressure only upon the first metal electrode.

14. A process according to claim 2, in which n-conducting GaAs is used for the epitaxial layer, for the first electrode, at least one of the metals Cr, Ni, Pt, Pd, Mo, Ti or Al is used, in the form of a galvanically produced layer.

* * * * *